(12) United States Patent
Yeo

(10) Patent No.: US 9,425,421 B2
(45) Date of Patent: Aug. 23, 2016

(54) GAP CONTROLLABLE DISPLAY DEVICE

(71) Applicant: Yong-Seok Yeo, Yongin (KR)

(72) Inventor: Yong-Seok Yeo, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 430 days.

(21) Appl. No.: 13/799,628

(22) Filed: Mar. 13, 2013

(65) Prior Publication Data

US 2014/0118678 A1    May 1, 2014

(30) Foreign Application Priority Data

Oct. 25, 2012  (KR) .................... 10-2012-0119020

(51) Int. Cl.
| | |
|---|---|
| *G02F 1/1339* | (2006.01) |
| *H01L 51/50* | (2006.01) |
| *H01L 51/52* | (2006.01) |
| *G02F 1/1333* | (2006.01) |
| *G02F 1/1335* | (2006.01) |

(52) U.S. Cl.
CPC .............. *H01L 51/50* (2013.01); *G02F 1/1335* (2013.01); *G02F 1/13394* (2013.01); *G02F 1/133371* (2013.01); *H01L 51/5215* (2013.01); *G02F 2001/13398* (2013.01); *G02F 2001/133394* (2013.01)

(58) Field of Classification Search
CPC ........ G02F 1/13; G02F 1/133; G02F 1/1339; G02F 1/133305; G02F 1/133512; G02F 1/13394; G02F 1/133371
USPC .............................. 349/155, 33, 202, 156, 43
See application file for complete search history.

(56) References Cited

U.S. PATENT DOCUMENTS

| | | | | |
|---|---|---|---|---|
| 5,956,112 | A * | 9/1999 | Fujimori et al. | 349/156 |
| 6,798,147 | B2 * | 9/2004 | Yang | G09G 3/3258 315/169.1 |
| 7,452,258 | B1 * | 11/2008 | Marzen | H01L 51/5237 313/512 |
| 2008/0291521 | A1 | 11/2008 | Kim et al. | |
| 2008/0291525 | A1 * | 11/2008 | Kim et al. | 359/291 |
| 2010/0201227 | A1 | 8/2010 | Choi et al. | |
| 2011/0127506 | A1 | 6/2011 | So | |
| 2012/0105333 | A1 * | 5/2012 | Maschmeyer et al. | 345/173 |
| 2012/0105963 | A1 * | 5/2012 | Klinghult et al. | 359/578 |
| 2012/0133622 | A1 * | 5/2012 | Brokken | G06F 3/016 345/204 |

FOREIGN PATENT DOCUMENTS

| | | | |
|---|---|---|---|
| KR | 10 2008-0103231 A | 11/2008 |
| KR | 10 2010-0092218 A | 8/2010 |
| KR | 10 2011-0087713 A | 8/2011 |

\* cited by examiner

*Primary Examiner* — Thoi Duong

(74) *Attorney, Agent, or Firm* — Lee & Morse, P.C.

(57) ABSTRACT

A display device including a first substrate; a display element layer on the first substrate; a second substrate on the display element layer; and a spacer layer between the first substrate and the second substrate.

16 Claims, 4 Drawing Sheets

(a)                                (b)

GAP CONTROLLABLE DISPLAY DEVICE

CROSS-REFERENCE TO RELATED APPLICATION

This application claims the benefit of Korean Patent Application No. 10-2012-0119020, filed on Oct. 25, 2012, in the Korean Intellectual Property Office, the disclosure of which is incorporated herein in its entirety by reference.

BACKGROUND

1. Field

The embodiments relate to a gap-controllable display device.

2. Description of the Related Art

With the development of an information-oriented society, research on flat panel displays has been gradually increased according to various demands. Recently, research on apparatuses using a liquid crystal display (LCD) and an organic light emitting display (OLED) has been conducted. For example, the OLED is in the limelight as a next-generation display because of merits such as a light weight, a thin type, and low power consumption, and the LCD may be used because of merits such as a large area and a long lifespan.

SUMMARY

The present disclosure has been made in an effort to provide a display device having an optimal light path of the display by using a material capable of changing a thickness at random to control an optimal light path.

The present disclosure has also been made in an effort to provide a display device capable of improving light transmittance in the case of an LCD and improving a viewing angle characteristic in the case of an OLED.

An exemplary embodiment of the present disclosure provides a display device, including: a first substrate; a display element layer disposed on the first substrate; a second substrate disposed on the display element layer; and a spacer layer disposed between the first substrate and the second substrate.

The spacer layer may be disposed between the first substrate and the display element layer.

The spacer layer may be disposed between the display element layer and the second substrate.

The spacer layer may be spaced apart from the display element layer to be disposed between the first substrate and the second substrate.

The display element layer may include a first electrode, a second electrode disposed to face the first electrode; and an active layer disposed between the first electrode and the second electrode.

The active layer may be formed as an organic emission layer.

In the case where the active layer is the organic emission layer, the display element layer may further include at least one of a hole injection layer (HIL) and a hole transfer layer (HTL) between the first electrode and the organic emission layer.

In the case where the active layer is the organic emission layer, the display element layer may further include at least one of an electron injection layer (EIL) and an electron transport layer (ETL) between the second electrode and the organic emission layer.

The active layer may be formed as a liquid crystal layer.

The spacer layer may include a first spacer electrode; a second spacer electrode disposed to face the first spacer electrode; and an electroactive polymer layer disposed between the first spacer electrode and the second spacer electrode.

A thickness of the electroactive polymer layer may depend on voltage applied between the first spacer electrode and the second spacer electrode.

The electroactive polymer layer may be made of transmissive polymer.

The electroactive polymer layer may contain any one of polyvinylidene fluoride (PVDF), polydimethyl siloxan (PDMS), and polyvinylidene fluoride-co-triflurethylene (PVFT).

The first spacer electrode and the second spacer electrode may contain transmissive materials.

The transmissive material may contain transparent conductive oxide (TCO).

The transparent conductive oxide may contain any one of ITO, IZO, ATO, AZO, and ZnO.

According to the exemplary embodiment of the present disclosure, it is possible to control a thickness of a display so that a display device may have an optimal light path.

It is also possible to improve light transmittance in the case of an LCD and improve a viewing angle characteristic in the case of an OLED.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
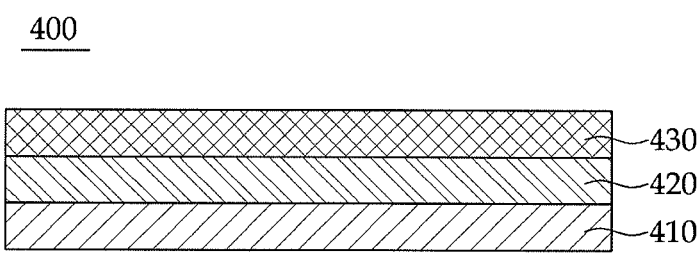
FIG. 1 illustrates a spacer layer according to an exemplary embodiment of the present disclosure.

Hereinafter, exemplary embodiments of the present disclosure will be described in more detail with reference to the accompanying drawings. The scope of the present disclosure is not limited to the exemplary embodiments to be described below and the accompanying drawings. Exemplary embodiments to be described below and illustrated in the drawings may include various equivalences and modifications.

For reference, respective components and shapes thereof are schematically drawn or exaggeratedly drawn in the accompanying drawings for easy understanding. Like reference numerals designate like elements throughout the drawings.

It will be understood that when a layer or an element is described as being "on" another layer or element, it may be directly disposed on another layer or element, or an intervening layer or element may also be present.

FIG. 1 illustrates a spacer layer 400 according to an exemplary embodiment of the present disclosure.

Referring to FIG. 1, the spacer layer 400 may include a first spacer electrode 410, a second spacer electrode 430 disposed to face or facing the first spacer electrode, and an electroactive polymer (EAP) layer 420 between the first spacer electrode 410 and the second spacer electrode 430.

The first spacer electrode 410 and the second spacer electrode 430 may apply voltage to the electroactive polymer (EAP) layer 420 to cause deformation of the electroactive polymer (EAP) layer 420.

The first spacer electrode 410 and the second spacer electrode 430 may include a conductive transmissive, e.g., optically transmissive, material. The conductive transmissive material may include a transparent conductive oxide (TCO). The transparent conductive oxide (TCO) may include, e.g., at least one of ITO, IZO, ATO, AZO, or ZnO.

The first spacer electrode 410 and the second spacer electrode 430 may be made of a flexible material deformed together by the deformation of the electroactive polymer (EAP) layer 420.

The first spacer electrode 410 and the second spacer electrode 430 may be made of metal or conductive metal oxide used as an electrode material in a semiconductor device.

The spacer layer 400 may include a voltage applicator for applying a voltage difference between the first spacer electrode 410 and the second spacer electrode 430 and an applied voltage controller.

The voltage applicator may apply a voltage difference between the first spacer electrode 410 and the second spacer electrode 430. When the voltage is applied between the first spacer electrode 410 and the second spacer electrode 430, a regular electric field E may be formed between the first spacer electrode 410 and the second spacer electrode 430.

The voltage controller may control the voltage applied by the voltage applicator. The voltage controller may control a magnitude of the electric field E formed between the first spacer electrode 410 and the second spacer electrode 430 by controlling the voltage difference.

The electroactive polymer (EAP) layer 420 may be a layer having a characteristic generating a strain when voltage is supplied. For example, a thickness d of the electroactive polymer (EAP) layer may be controlled according to the applied voltage, i.e., the electroactive polymer (EAP) layer may have a thickness that varies in response to a voltage applied thereto.

The electroactive polymer (EAP) layer 420 may include at least one of polyvinylidene fluoride (PVDF), polydimethyl siloxan (PDMS), or polyvinylidene fluoride-co-triflurethylene (PVFT). In an implementation, the electroactive polymer layer 420 may include a transmissive, e.g., an optically transmissive, polymer.

Figure 2:
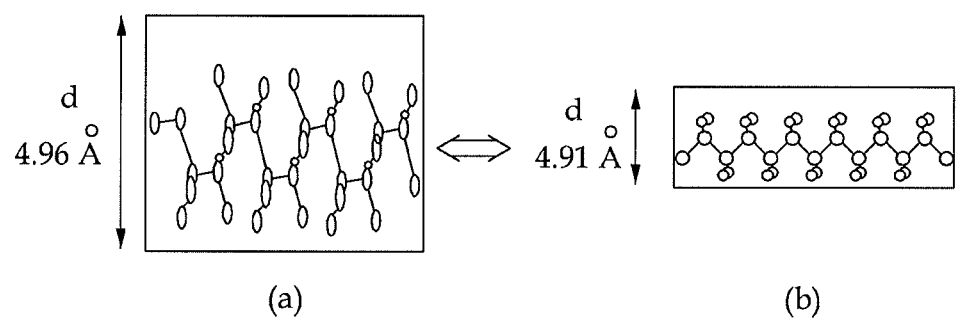
FIG. 2 illustrates a diagram showing (a) before voltage is applied to an electroactive polymer layer and (b) after voltage is applied to the electroactive polymer layer.

FIG. 2 illustrates a diagram of a molecular structure (a) before voltage is applied to the electroactive polymer (EAP) layer 420 and a molecular structure (b) after voltage is applied to the electroactive polymer (EAP) layer 420.

For example, FIG. 2 illustrates a molecular structure (a) before voltage is applied to polyvinylidene fluoride (PVDF) electroactive polymer (EAP) layer 420 and a molecular structure (b) after voltage is applied to polyvinylidene fluoride (PVDF).

The PVDF is a material having regular polarization (spontaneous polarization) before the voltage is applied, and a direction of the polarization may be changed by an electric field generated when the voltage is applied to the PVDF. As a result, deformation of the overall shape of the PVDF may be generated.

A thickness of the PVDF before and after applying the voltage to the PVDF may be changed by about 0.05 Å, e.g., from 4.96 Å to 4.91 Å.

Figure 3:
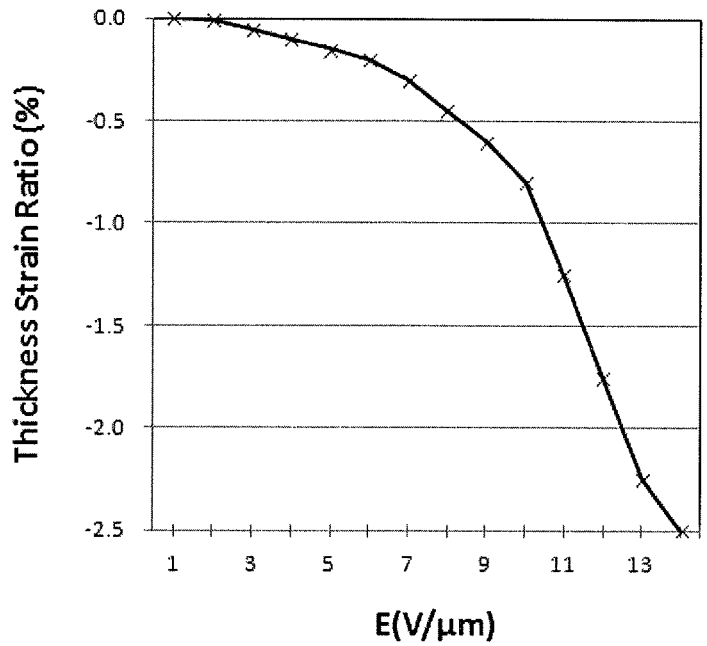
FIG. 3 illustrates a graph showing a thickness strain ratio depending on voltage applied to an electroactive polymer layer according to the exemplary embodiment of the present disclosure.

FIG. 3 illustrates a graph of a thickness strain ratio depending on the voltage applied to the electroactive polymer (EAP) layer 420.

An x-axis of the graph illustrates a magnitude E (V/μm) of the electric field applied to the electroactive polymer (EAP) layer 420, and a y-axis of the graph illustrates a strain ratio (%) to an initial thickness of the electroactive polymer (EAP) layer 420.

As the magnitude of the electric field E is changed from 0 V/μm to 13 V/μm, the strain ratio (%) to the initial thickness of the electroactive polymer (EAP) layer 420 is changed from 0% to −2.5%.

For example, when the initial thickness of the electroactive polymer (EAP) layer 420 is set to 2 μm, the thickness of the electroactive polymer (EAP) layer 420 may be controlled within a range of about 40 nm, e.g., ± about 40 nm.

The electroactive polymer (EAP) layer 420 may be included in the display device. Thus, the thickness of the display device may be controlled. Accordingly, a thickness error of the display (that may be generated in a process of the display device) may be controlled.

For example, in the case of the organic light emitting display, light generated from the organic emission layer may extracted outside through functional layers in the organic light emitting display. In this case, it may be efficient if the thickness of the many function layers is set so that the light generated from the organic emission layer may be maximally extracted.

The organic light emitting display may be manufactured so as to have a thickness sufficient to have an optimal light path in the process. However, an error in the thickness may occur in the process or after the process. Thus, if the spacer layer with a controllable thickness is used, the display device may have a desired thickness.

By controlling the thickness, light extraction efficiency may be maximized and a viewing angle characteristic may be improved by reducing a change of the spectrum caused by a difference in the light path.

Figure 4A:
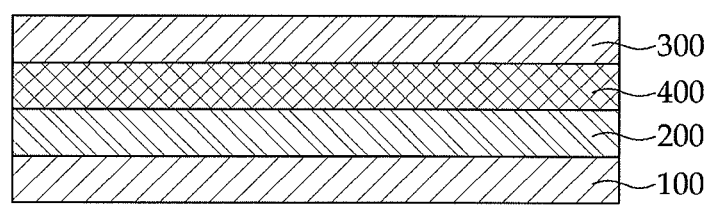
FIGS. 4A and 4B illustrate an organic light emitting display device including a spacer layer according to embodiments of the present disclosure, respectively.
Figure 4B:
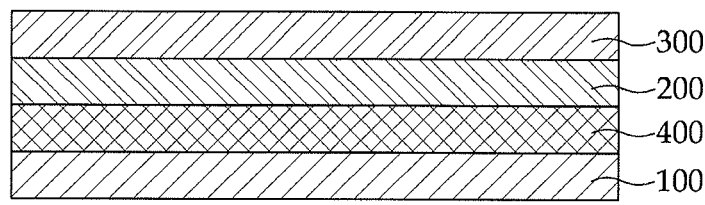
Figure 5:
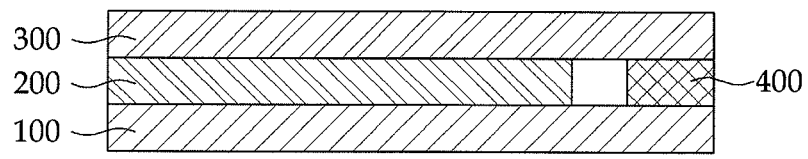
FIG. 5 illustrates an organic light emitting display device including a spacer layer according to another embodiment of the present disclosure.

FIGS. 4A, 4B and 5 illustrate display devices including a spacer layer 400 according to exemplary embodiments of the present disclosure.

Referring to FIGS. 4A, 4B and 5, the display device including a spacer may include a first substrate 100, a display element layer 200 on the first substrate 100, a second substrate 300 on the display element layer 200, and a spacer layer 400 between the first substrate 100 and the second substrate 300.

The spacer layer 400 may be between the first substrate 100 and the display element layer 200 (see FIG. 4A) or between the display element layer 200 and the second substrate 300 (see FIG. 4B).

In an implementation, the spacer layer 400 may be spaced apart from the display element layer 200 to be disposed between the first substrate 100 and the second substrate 300 (see FIG. 5).

The first substrate 100 may include a thin film transistor layer for applying voltage to the display element layer 200 and the spacer layer 400.

In the thin film transistor layer, a gate line and a data line (for defining a pixel area) may vertically cross each other, and a thin film transistor may be formed at a portion where the gate line and the data line cross each other.

A common electrode (which may be connected with a wiring formed on the first substrate 100) may be included on the second substrate 300.

The second substrate 300 may include a protective layer (for protecting the display element layer 200). The protective layer may be formed by a glass substrate or a multi-layered thin film structure.

Figure 6:
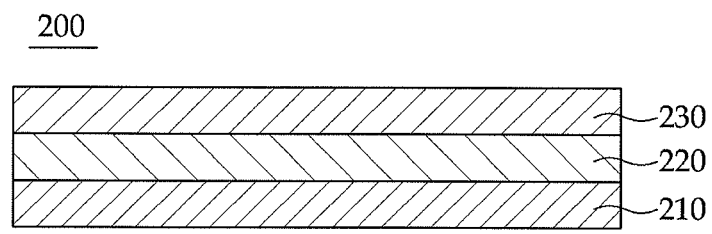
FIG. 6 illustrates a display element layer according to an exemplary embodiment of the present disclosure.

FIG. 6 illustrates the display element layer 200 according to an exemplary embodiment of the present disclosure.

The display element layer 200 may include a first electrode 210, a second electrode 230 disposed to face or facing the first electrode 210, and an active layer between the first electrode 210 and the second electrode 230.

In addition, the first electrode 210 and the second electrode 220 may be made of metal or a conductive transmissive, e.g., optically transmissive, material. The conductive transmissive material may include, e.g., a transparent conductive oxide (TCO). The transparent conductive oxide (TCO) may include at least one of ITO, IZO, ATO, AZO, or ZnO.

The active layer 220 may be, e.g., a liquid crystal layer or an organic emission layer.

In the case where the active layer 220 is the liquid crystal layer, the display element layer 200 may be a liquid crystal display element, and the display device may be a liquid crystal display.

In the case where the active layer 220 is the liquid crystal layer, the spacer layer 400 may control a thickness of a cell gap between the active layer 220 and the second substrate 300 so that the liquid crystal display may have an optimal light path.

In the case where the active layer 220 is the organic emission layer, the display element layer 200 may be an organic emission element, and the display device may be an organic light emitting display.

In the case where the active layer 220 is the organic emission layer, the spacer layer 400 may control a thickness so that the light generated from the organic emission layer has an optimal light path between the organic emission layer and the second substrate.

In the case where the active layer 220 is the organic emission layer, a hole transfer layer (HTL) and/or a hole injection layer (HIL) may be disposed between the first electrode 210 and the active layer 220, and/or an electron transport layer (ETL) and/or an electron injection layer (EIL) may be disposed between the active layer 220 and the second electrode 230.

Figure 7:
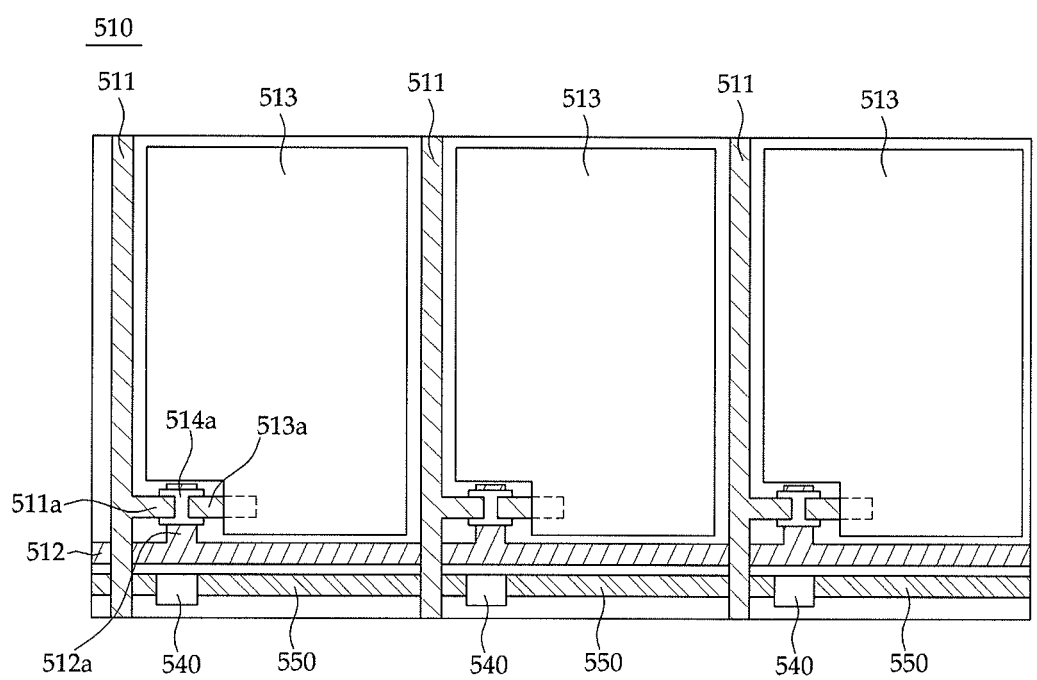
FIG. 7 illustrates a top view of a liquid crystal display including a spacer layer according to an exemplary embodiment of the present disclosure.

FIG. 7 illustrates a top view of a liquid crystal display including a spacer layer according to an exemplary embodiment of the present disclosure.

Figure 8:
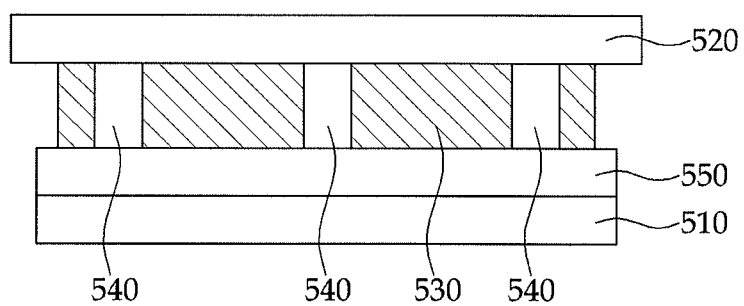
FIG. 8 illustrates a side view of the liquid crystal display including the spacer layer according to an exemplary embodiment of the present disclosure.

FIG. 8 illustrates a side view of the liquid crystal display including the spacer layer according to the exemplary embodiment of the present disclosure.

FIGS. 7 and 8 illustrates diagrams for describing the liquid crystal display including the spacer layer, and a repeated description of some of the constituent elements may be briefly expressed or omitted.

Referring to FIGS. 7 and 8, the liquid crystal display may include a first substrate 510, a second substrate 520 disposed to face or facing the first substrate, a liquid crystal layer 530 between the first substrate 510 and the second substrate 520, an electroactive polymer layer 540 (for maintaining a regular gap between the first substrate 510 and the second substrate 520), and an electrode wiring 550 (for applying voltage to the electroactive polymer layer 540).

On the first substrate 510, gate lines 511 and data lines 512 for defining pixel areas may be arranged to vertically cross each other.

On the first substrate 510, a gate electrode 511a (protruding from the gate line 511), a source electrode 512a (protruding from the data line 512), a drain electrode 513a (spaced apart from the source electrode 512a at a predetermined interval), and a semiconductor layer 514a (covering the gate electrode 511a) may be formed. The gate electrode 511a, the source electrode 512a, the drain electrode 513a, and the semiconductor layer 514a may form a thin film transistor layer.

A pixel electrode 513 may be formed in a region formed when the gate line 511 and the data line 512 cross each other.

The electrode wiring 550 may be simultaneously formed on the first substrate 510 when the data line 512 is formed.

The electrode wiring 550 may be parallel to the data line 512. The electrode wiring 550 may be parallel to the gate line 511. The electrode wiring 550 may be formed on the second substrate 520. The electroactive polymer layer 540 may be formed on the electrode wiring 550. One or more electroactive polymer layers 540 formed on the electrode wiring 550 may be formed for each pixel electrode 513.

One side of the electroactive polymer layers 540 may be connected with the electrode wiring 550, and another side may be connected with the second substrate 520. In this case, the electrode wiring 550 may correspond to the first spacer electrode 410 of FIG. 1, and the second substrate 520 may correspond to the second spacer electrode 430 of FIG. 1.

For example, a thickness of the electroactive polymer layers 540 may be controlled by a voltage applied between the electrode wiring 550 and the second substrate 520. In other words, a thickness of the electroactive polymer layers 540 may vary in response to a voltage applied between the first spacer electrode and the second spacer electrode or between the electrode wiring 550 and the second substrate 520.

By way of summation and review, display devices using the LCD and the OLED may experience issues regarding light extraction efficiency. For example, how much light generated in the LCD and the OLED is extracted may be important with respect to performance. Accordingly, in the LCD and the OLED fields, research on methods of maximizing light extraction efficiency while reducing power consumption is being conducted.

The liquid crystal display (LCD), as a device which displays figures or images by applying voltage to both ends of a liquid crystal cell to change alignment of the liquid crystal molecules and generate contrast, includes a reflective LCD displaying an image by reflecting light incident from the front side of an LCD panel onto a reflector attached to the rear side of the panel and a transmissive LCD displaying an image by inputting ambient light or fluorescence according to a driving mode.

The transmissive LCD using a rear light source may have high luminance and contrast indoors or in dark places, while may not have high luminance and contrast outdoors or in bright places. The reflective LCD uses ambient light as a light source. Thus, an electro-optical characteristic is good outdoors or in the bright places, but there may be limitations for use indoors and in the dark places.

Recently, as a range of mobility of displays is expanded, a transflective LCD in which a display characteristic may be ensured indoors and outdoors is in the limelight, and in the case of the transflective LCD, a predetermined cell gap may be required in order to compensate for a difference in a characteristic due to a light path difference in a reflective area and a transmissive area.

In order to maintain a predetermined cell gap between an upper substrate and a lower substrate of the LCD, the predetermined cell gap may be maintained by using a microcapsule type spacer or a column type spacer.

In the case of using such spacers, a cell gap having an optimal light path in the LCD may be maintained, but transmittance may deteriorate due to the spacer.

An organic light emitting display (OLED) is a device for emitting light when an electron supplied from a cathode is coupled with a hole supplied from an anode in an organic emission layer formed between the anode and the cathode.

Light generated from the organic emission layer of the OLED is extracted outside through functional layers in the OLED, and in this case, a viewing angle characteristic may deteriorate due to a change of a spectrum according to a difference in the light path.

In a manufacturing process of the liquid crystal display, a cell gap may be controlled in order to increase light extraction efficiency. Here, the cell gap refers to a thickness between the first substrate and the second substrate.

Light extraction efficiency of the liquid crystal display may be maximized by controlling the thickness as described above.

The embodiments provide an organic light emitting display (OLED) and/or a liquid crystal display (LCD), and more particularly, a display device including a spacer layer capable of controlling a gap between layers of the display device.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A display device, comprising:
   a first substrate including a thin film transistor layer;
   a display element layer on the first substrate;
   a second substrate on the display element layer; and
   a spacer layer between the first substrate and the second substrate,
   wherein the spacer layer includes:
   a first spacer electrode on the first substrate,
   a second spacer electrode on the second substrate and facing the first spacer electrode, and
   an electroactive polymer layer between the first spacer electrode and the second spacer electrode, a distance between the first substrate and the second substrate varying in response to a voltage applied between the first spacer electrode and the second spacer electrode such that the display device has a desired thickness that is controllable in response to the voltage applied between the first spacer electrode and the second spacer electrode.

2. The display device of claim 1, wherein the spacer layer is between the first substrate and the display element layer.

3. The display device of claim 1, wherein the spacer layer is between the display element layer and the second substrate.

4. The display device of claim 1, wherein the spacer layer is spaced apart from the display element layer between the first substrate and the second substrate.

5. The display device of claim 1, wherein the display element layer includes:
   a first electrode,
   a second electrode facing the first electrode, and
   an active layer between the first electrode and the second electrode.

6. The display device of claim 5, wherein the active layer is an organic emission layer.

7. The display device of claim 6, wherein the display element layer further includes at least one of a hole injection layer (HIL) or a hole transfer layer (HTL) between the first electrode and the organic emission layer.

8. The display device of claim 6, wherein the display element layer further includes at least one of an electron injection layer (EIL) or an electron transport layer (ETL) between the second electrode and the organic emission layer.

9. The display device of claim 5, wherein the active layer is a liquid crystal layer.

10. The display device of claim 1, wherein a thickness of the electroactive polymer layer varies in response to the voltage applied between the first spacer electrode and the second spacer electrode.

11. The display device of claim 1, wherein the electroactive polymer layer includes a transmissive polymer.

12. The display device of claim 1, wherein the electroactive polymer layer includes at least one of polyvinylidene fluoride (PVDF), polydimethyl siloxane (PDMS), or polyvinylidene fluoride-co-trifluoroethylene fluoride-co-trifluroethylene (PVFT).

13. The display device of claim 1, wherein the first spacer electrode and the second spacer electrode include a transmissive material.

14. The display device of claim 13, wherein the transmissive material is a transparent conductive oxide.

15. The display device of claim 14, wherein the transparent conductive oxide includes at least one of ITO, IZO, ATO, AZO, or ZnO.

16. The display device of claim 1, wherein a length of a light path from the display element varies with the varying distance between the first substrate and the second substrate.

* * * * *